US008624684B2

(12) United States Patent
Czimmek

(10) Patent No.: US 8,624,684 B2
(45) Date of Patent: Jan. 7, 2014

(54) ADAPTIVE CURRENT LIMIT OSCILLATOR STARTER

(75) Inventor: Perry Czimmek, Williamsburg, VA (US)

(73) Assignee: Continental Automotive Systems, Inc, Auburn Hills, MI (US)

( * ) Notice: Subject to any disclaimer, the term of this patent is extended or adjusted under 35 U.S.C. 154(b) by 60 days.

(21) Appl. No.: 13/332,539

(22) Filed: Dec. 21, 2011

(65) Prior Publication Data

US 2012/0268222 A1 Oct. 25, 2012

Related U.S. Application Data

(66) Substitute for application No. 61/478,424, filed on Apr. 22, 2011.

(51) Int. Cl.
- *H03B 5/12* (2006.01)
- *B05B 1/24* (2006.01)
- *H05B 6/02* (2006.01)

(52) U.S. Cl.
USPC ......... 331/117 R; 331/172; 239/81; 239/130; 239/135; 219/600; 219/205

(58) Field of Classification Search
USPC ........ 331/117 R, 117 FE, 109, 182, 183, 185, 331/172, 173; 239/132, 81, 128, 130, 135; 122/5.51, 5.52; 219/200, 201, 202, 219/205, 600, 635; 137/334, 341
See application file for complete search history.

(56) References Cited

U.S. PATENT DOCUMENTS

| | | | |
|---|---|---|---|
| 6,064,277 A * | 5/2000 | Gilbert | 331/117 R |
| 6,614,288 B1 | 9/2003 | Dagan et al. | |
| 6,680,655 B2 * | 1/2004 | Rogers | 331/109 |
| 6,784,753 B2 * | 8/2004 | Leenaerts et al. | 331/36 C |
| 7,481,376 B2 * | 1/2009 | Hornby et al. | 239/5 |
| 7,628,340 B2 | 12/2009 | Czimmek | |
| 7,677,468 B2 | 3/2010 | Hornby et al. | |
| 7,714,548 B1 | 5/2010 | Wittenbreder, Jr. | |
| 8,143,954 B2 * | 3/2012 | Bolz | 331/2 |
| 2007/0221747 A1 | 9/2007 | Hornby et al. | |
| 2007/0221761 A1 | 9/2007 | Hornby et al. | |
| 2007/0221874 A1 | 9/2007 | Hornby et al. | |
| 2007/0235086 A1 | 10/2007 | Hornby et al. | |
| 2007/0235569 A1 | 10/2007 | Hornby et al. | |

FOREIGN PATENT DOCUMENTS

WO 01/26431 A1 4/2001

OTHER PUBLICATIONS

Philips Semiconductors; "Data Sheet: HEF4516B MSI Binary up/down counter"; Jan. 1995.*
International Search Report and Written Opinion dated Jul. 4, 2012, from corresponding International Patent Application No. PCT/US2012/028013.

* cited by examiner

*Primary Examiner* — Ryan Johnson

(57) ABSTRACT

A power-oscillator-starting circuit for an electronic high frequency induction-heater driver. The induction-heater driver, upon receipt of a turn-on signal, generates a high frequency alternating current, wherein the alternating current through an induction-heater coil is magnetically coupled to an appropriate loss component for a variable-spray fuel-injection system. The induction-heater driver uses a power oscillator that is started and restarted as is appropriate based on a threshold current limit referenced to the supply voltage of the induction-heater driver.

12 Claims, 4 Drawing Sheets

ADAPTIVE CURRENT LIMIT OSCILLATOR STARTER

CROSS-REFERENCE TO RELATED APPLICATIONS

This application is a non-provisional of, and claims priority to the Apr. 22, 2011, filing date of, U.S. provisional patent application Ser. No. 61/478,424, entitled Adaptive Current Limit Oscillator Starter, the entire content of which is incorporated herein by reference.

And this application is related to the following U.S. non-provisional patent applications filed on the same day as this application:

Synchronous Full-Bridge Power Oscillator with Leg Inductors, invented by Perry Czimmek, and identified by Ser. No. 13/332,501;

Synchronous Full-Bridge Power Oscillator, invented by Perry Czimmek, and identified by Ser. No. 13/332,506;

Synchronized Array Bridge Power Oscillator, invented by Perry Czimmek and Mike Hornby, and identified by Ser. No. 13/332,517;

Synchronized Array Power Oscillator with Leg Inductors, invented by Perry Czimmek and Mike Hornby, and identified by Ser. No. 13/332,521; and Variable Spray Injector with Nucleate Boiling Heat Exchanger, invented by Perry Czimmek and Hamid Sayar, and identified by Ser. No. 13/332,532.

BACKGROUND

Embodiments of the invention relate generally to power oscillators for induction heaters and more particularly to such power oscillators for variable spray fuel injectors.

There is a continued need for improving the emissions quality of internal combustion engines. At the same time, there is pressure to minimize engine crank times and time from key-on to drive-away, while maintaining maximum fuel economy. Those pressures apply to engines fueled with alternative fuels such as ethanol as well as to those fueled with gasoline.

During cold temperature engine start, the conventional spark ignition internal combustion engine is characterized by high hydrocarbon emissions and poor fuel ignition and combustibility. Unless the engine is already at a high temperature after stop and hot-soak, the crank time may be excessive, or the engine may not start at all. At higher speeds and loads, the operating temperature increases and fuel atomization and mixing improve.

During an actual engine cold start, the enrichment necessary to accomplish the start leaves an off-stoichiometric fueling that materializes as high tail-pipe hydrocarbon emissions. The worst emissions are during the first few minutes of engine operation, after which the catalyst and engine approach operating temperature. Regarding ethanol fueled vehicles, as the ethanol percentage fraction of the fuel increases to 100%, the ability to cold start becomes increasingly diminished, leading some manufacturers to include a dual fuel system in which engine start is fueled with conventional gasoline and engine running is fueled with the ethanol grade. Such systems are expensive and redundant.

Another solution to cold start emissions and starting difficulty at low temperature is to pre-heat the fuel to a temperature where the fuel vaporizes quickly, or vaporizes immediately ("flash boils"), when released to manifold or atmospheric pressure. Pre-heating the fuel replicates a hot engine as far as fuel state is considered.

A number of pre-heating methods have been proposed, most of which involve preheating in a fuel injector. Fuel injectors are widely used for metering fuel into the intake manifold or cylinders of automotive engines. Fuel injectors typically comprise a housing containing a volume of pressurized fuel, a fuel inlet portion, a nozzle portion containing a needle valve, and an electromechanical actuator such as an electromagnetic solenoid, a piezoelectric actuator or another mechanism for actuating the needle valve. When the needle valve is actuated, the pressurized fuel sprays out through an orifice in the valve seat and into the engine.

One technique that has been used in preheating fuel is to inductively heat metallic elements comprising the fuel injector with a time-varying magnetic field. Exemplary fuel injectors having induction heating are disclosed in U.S. Pat. No. 7,677,468, U.S. Patent Application No's: 20070235569, 20070235086, 20070221874, 20070221761 and 20070221747, the contents of which are hereby incorporated by reference herein in their entirety. The energy is converted to heat inside a component suitable in geometry and material to be heated by the hysteretic and eddy-current losses that are induced by the time-varying magnetic field.

The inductive fuel heater is useful not only in solving the above-described problems associated with gasoline systems, but is also useful in pre-heating ethanol grade fuels to accomplish successful starting without a redundant gasoline fuel system.

Because the induction heating technique uses a time-varying magnetic field, the system includes electronics for providing an appropriate high frequency alternating current to an induction coil in the fuel injector.

Conventional induction heating is accomplished with hard-switching of power, or switching when both voltage and current are non-zero in the switching device. Typically, switching is done at a frequency near the natural resonant frequency of a resonator, or tank circuit. The resonator includes an inductor and capacitor that are selected and optimized to resonate at a frequency suitable to maximize energy coupling into the heated component.

The natural resonant frequency of a tank circuit is $fr=1/(2\pi \sqrt{LC})$, where L is the circuit inductance and C is the circuit capacitance. The peak voltage at resonance is limited by the energy losses of the inductor and capacitor, or decreased quality factor, Q, of the circuit. Hard-switching can be accomplished with what are called half-bridge or full-bridge circuits, comprising a pair or two pairs of semiconductor switches, respectively. Hard-switching of power results in the negative consequences of switching noise, and high amplitude current pulses at resonant frequency from the voltage supply, or harmonics thereof. Also, hard switching dissipates power during the linear turn-on and turn-off period when the switching device is neither fully conducting nor fully insulating. The higher the frequency of a hard-switched circuit, the greater the switching losses.

The preferred heater circuit therefore provides a method of driving a heated fuel injector wherein switching is done at the lowest possible interrupted power. This heater circuit was disclosed in U.S. Pat. No. 7,628,340, Title: Constant Current Zero-Voltage Switching Induction Heater Driver for Variable Spray Injection. Ideally, energy should be replenished to the tank circuit when either the voltage or the current in the switching device is zero. It is known that the electromagnetic noise is lower during zero-voltage or zero-current switching, and is lowest during zero-voltage switching, this is the method of U.S. Pat. No. 7,628,340. It is also known that the switching device dissipates the least power under zero switching. That ideal switching point occurs twice per cycle when the sine wave crosses zero and reverses polarity; i.e., when the sine wave crosses zero in a first direction from positive to negative, and when the sine wave crosses zero in a second direction from negative to positive.

Given the above heater driver implementation, as well as any power oscillator, there remains a possible problem, which is the oscillator failing to oscillate, due to a load impedance from the induction heating coil that is too low, or due to a supply voltage to the heater driver that is too low, or due to a transient interruption of the oscillation from some other source. When the oscillator fails to oscillate, the consequence is a failure to inductively heat and possible damage due to excessive current in a component of the power oscillator. The latter may be addressed with a current limit or fault shutdown. But the oscillator still failed to oscillate and inductively heat. An additional oscillator may be used to start the power oscillator upon diagnostic detection. But it does not prevent or utilize the excessive fault current condition inherently, nor does it synchronize the normal current with the fault current to better enable oscillation.

It would advance the state of the art, therefore, to detect the failure to oscillate, start—or restart—the oscillator as is appropriate, and synchronize the oscillator start—or restart—to the excessive fault current such that the fault current is contributing to the oscillation attempt.

BRIEF SUMMARY

Embodiments of the invention provide for detecting excessive current and concurrently detecting oscillation status for starting, or restarting, the oscillator. Additionally, embodiments of the invention compensate the detection of the excessive current for any change in supply voltage to the induction heater driver as supply voltage variation would effect the level of excessive current. Additionally, embodiments of the invention cause the power oscillator to synchronize with the excessive current such that this current may aid in the oscillation function.

Embodiments of the invention are described with reference to implementation on a previously disclosed power oscillator, Continental Reference Number: 2011E00365US, whose topology uses two pairs of complimentary pairs of power switching transistors in a modified full-bridge, or H-bridge, configuration. Deviations from a full-bridge driver include that: (1) the bridge is fed from a constant-current source inductor, and (2) the load section of the conventional full bridge is replaced with the resonant tank circuit. The oscillator-synchronous inherent zero-switching topology that drives the gates of the complimentary pairs of transistors in alternating sequence of diagonal pairs is a further deviation from a conventional full-bridge.

DETAILED DESCRIPTION

Ideally, energy should be replenished to the tank circuit when either the voltage or the current in the switching device is zero. The electromagnetic noise is lower during zero-voltage or zero-current switching and is lowest during zero-voltage switching. The switching device dissipates the least power under zero switching. That ideal switching point occurs twice per cycle when the sine wave crosses zero and reverses polarity; i.e., when the sine wave crosses zero in a first direction from positive to negative, and when the sine wave crosses zero in a second direction from negative to positive. The energy replenishment is enabled by semiconductor switches and the zero-voltage switching is synchronized with the resonance of the oscillator tank circuit.

Figure 1:
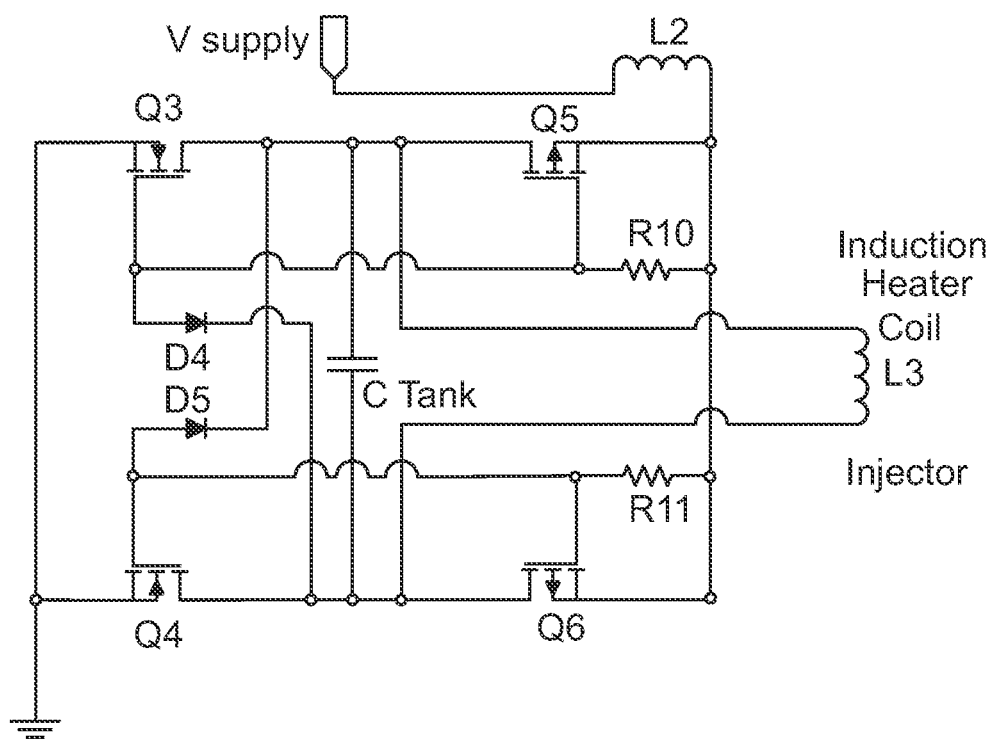
FIG. 1 is a simplified electrical schematic diagram showing the synchronous bridge oscillator with source inductor and without a transformer and without a center-tap in accordance with 2011E00365US.

Embodiments of the invention provide for a means of detecting an excessive current condition, and using that confirmation as an indicator of oscillator stalling and concurrently as an input state to help decide which of the oscillator power switching devices are the current-carrying devices and therefore reverse their state. The integrated functions of the reference oscillator will be an example oscillator that is disclosed in 2011E00364US as a synchronous full-bridge power oscillator heater driver and that will be explained with reference to FIG. 1, which is a simplified representation of the oscillator circuit with many of the basic components not shown for clarity. Specific or general values, ratings, additions, inclusion or exclusion of components are not intended to affect the scope of the invention.

L3 may be located inside a fuel injector. L3 is an induction heater coil that provides ampere-turns for induction heating a suitable fuel-injector component.

A synchronous full-bridge power oscillator in accordance with embodiments of the invention may include R10, R11, D4, D5, Q3, Q4, Q5, Q6, L2, C tank and L3. Q3 and Q4 are enhancement-type N-MOSFET (N-channel Metal-Oxide-Semiconductor Field-Effect Transistor) switches that alternatively connect tank resonator, C tank and L3, circuit to ground and, when each is turned on in the respective state, enables current to flow through induction heater coil and ground. Q5 and Q6 are enhancement-type P-MOSFET (P-channel Metal-Oxide-Semiconductor Field-Effect Transistor) switches that alternatively connect tank resonator, C tank and L3, circuit to the voltage supply sourced through L2, and with Q3 and Q4 in the appropriate state, enable current to flow through induction heater coil. The voltage supply may be a power supply, or in the case of a vehicle, a battery or an alternator, and is a source of potential energy to replenish energy lost in the oscillator.

C tank and L3 are the tank resonator capacitor and tank resonator inductor, respectively, of a resonant tank circuit. The resonant frequency of the tank circuit is $fr=1/(2\pi\sqrt{LC})$, where L is the heater coil inductance L3 and C is the capacitance of tank capacitor C tank. The peak voltage in the tank circuit is set by $V_{out}=\pi*V_{in}$ where $V_{in}$ is the supply voltage. The current level in the tank circuit is determined from the energy balance of $$\frac{1}{2}LI^2 = \frac{1}{2}CV^2.$$

The zero-switching power oscillator circuit should be self-starting in oscillation, but may be forced into oscillation by selectively sequencing the switching of Q3-Q6 in a full-reversing H-bridge strategy. The embodiment of this invention takes advantage of this for this type of oscillator. The complimentary pairs, or here, the pairs of transistors that are flowing current between the MOSFET 'drain' and 'source' at the same time are Q6 and Q3 or Q5 and Q4. It is not desirable to have Q3 flowing current when Q5 flows current, and likewise, it is not desirable to have Q4 flowing current when Q6 flows current. When Q5 is flowing current, current passes through the induction heater coil L3 and then through Q4 to ground. When Q6 is flowing current, current passes through the induction heater coil L3 in the reverse direction as when Q5 was flowing current, and then through Q3 to ground, this is 'full-reversal' of current.

A MOSFET is a device that has a threshold for an amount of Coulomb charge into the gate, which is drain-source current-dependent. Satisfying the charge threshold enhances the device into an 'on' state. First and second gate resistors R10, R11 supply the gate charging current to first and second legs of the H-bridge. R10 supplies current to gates of Q3 and Q5, R11 supplies current to the gates of Q4 and Q6, respectively, and R10, R11 limit the current flowing into first and second gate diodes D4, D5, respectively. Q5 and Q6, P-MOSFET conduct between drain and source when source is more positive than gate. Q3 and Q4, N-MOSFET conduct between drain and source when source is more negative than gate.

The loading caused by the resistive and hysteretic loss of the heated component reflects back as a loss in the resonant tank circuit. That loss is replenished by current flowing from a current source inductor L2 to the top bridge transistors, Q5 and Q6. Depending on the state of reversal of the H-bridge in which the current flows, the current will flow either through Q5 or Q6 and then through induction heater coil L3. L2 supplies current to the tank circuit from the energy stored in its magnetic field. That energy is replenished from the supply voltage as a current that constantly flows into L2 during operation of the synchronous full-bridge power oscillator. L2 also provides transient separation of tank circuit from voltage source such that the tank voltage may be instantaneously higher than the source voltage during oscillation.

If current is flowing through Q5, as determined by the polarity of the sine wave half-cycle at that time, then the conduction to ground from Q4 drain-to-source is pulling charge out of the gate of Q5 and Q3 through forward biased D4. Q3 is also now not conducting and does not pull the gate charge out of Q6 and Q4 to ground through D5. Meanwhile R10 draws current from the supply voltage. But the IxR voltage drop across R10 cannot charge the gate of Q5 and Q3 with the gate shunted to ground by conduction through Q4.

When the sine wave crosses zero, then Q4 becomes reverse biased across the switching junction and forward biased across the internal intrinsic diode and therefore conducts current through the internal intrinsic diode to reverse-bias D4. D4 stops conducting current away from the Q5 and Q3 gate, and R10 can charge the gate of Q5 and Q3, which then stops conduction in Q5 and starts conduction in Q3 to begin conducting current for the continuing sine half-cycle. Q3 also pulls the gate charge out of Q6 and Q4 to ground through the now forward biased D5 and holds Q4 in a non-conducting state which continues to allow R10 to enhance Q3. And Q6 conducts.

That process repeats as the sine wave alternates polarity, crossing zero in a first direction from negative to positive, and then in a second direction from positive to negative. This generates full-reversal of current in L3, the induction heater coil. Current continues to be replenished in the tank circuit from L2. An IGBT (Insulated Gate Bipolar Transistor) device can replace the N-MOSFET in this embodiment if the intrinsic diode of the N-MOSFET is represented by the addition of an external diode across the drain and source of the IGBT. This summarizes the reference oscillator operation.

Figure 2A:
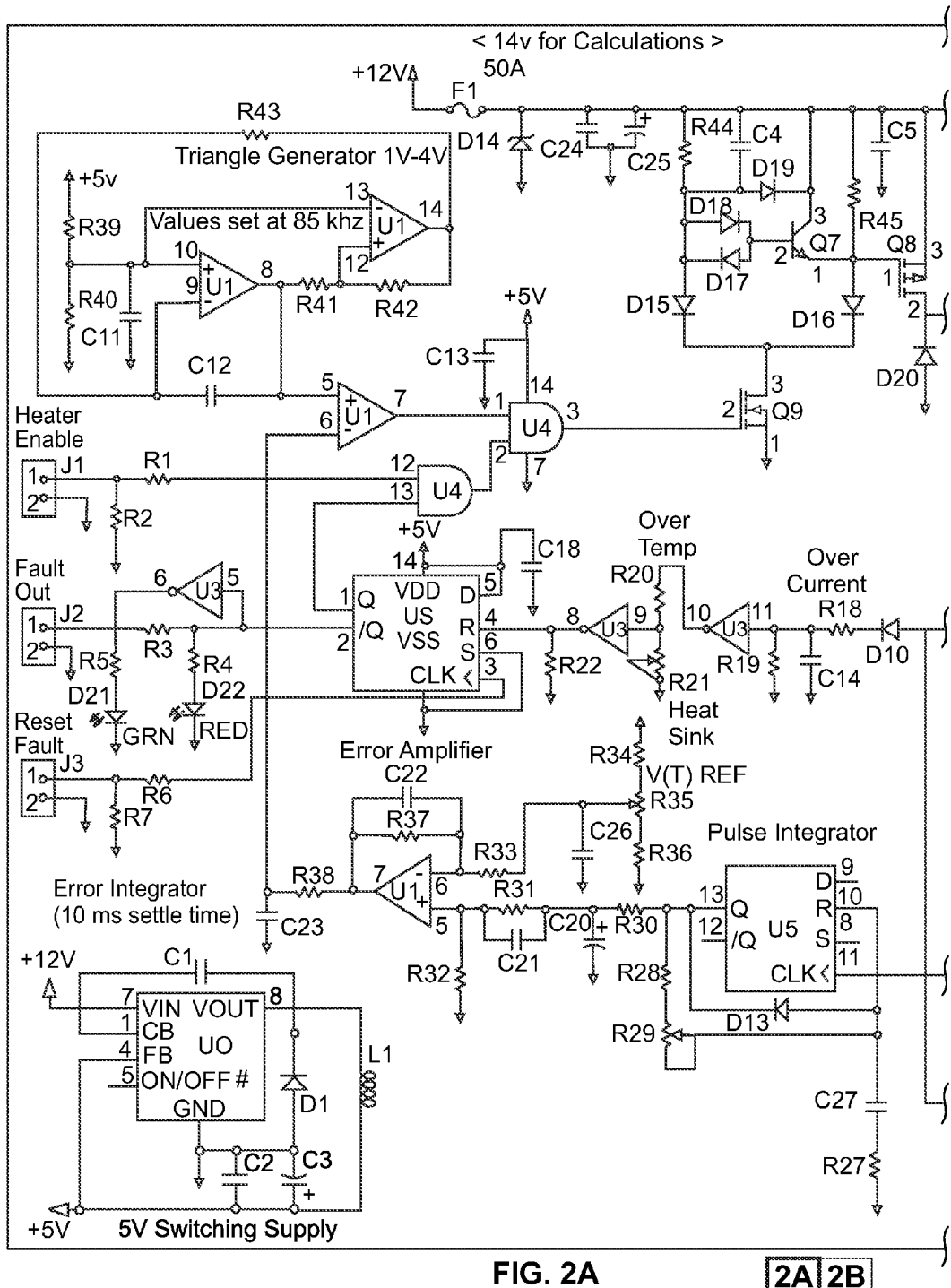
FIGS. 2A and 2B each show a portion of a schematic diagram of a power oscillator for a variable spray fuel injector in accordance with embodiments of the invention.
Figure 2B:
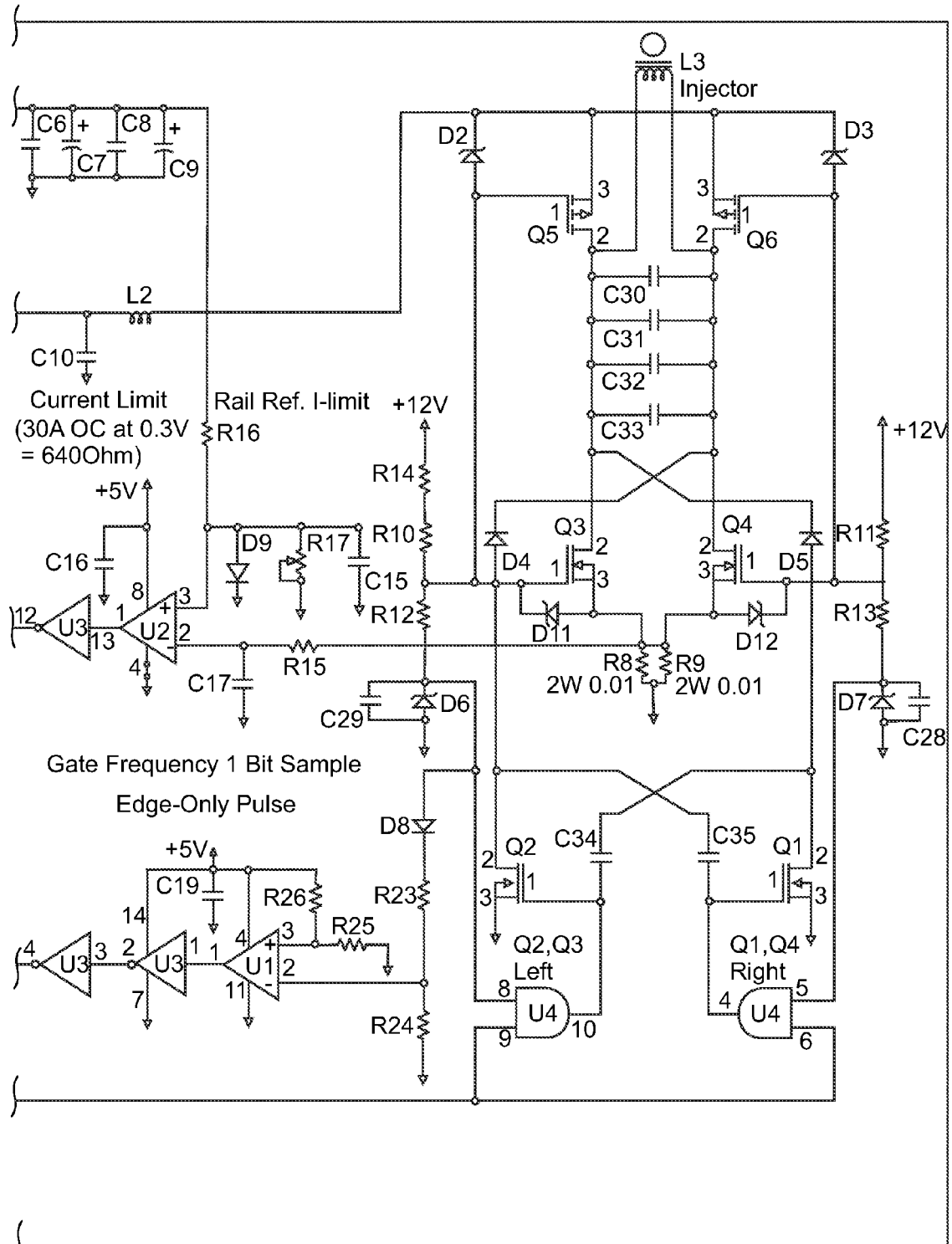

The remaining functions of the embodiment described in this specification, including embodiments of the invention disclosed herein, will be described with reference to FIGS. 2A and 2B. Ancillary components, which may be included around the synchronous full-bridge power oscillator in accordance with embodiments of the invention, will now be described. R14 is an "unbalancing" resistor of relatively small value to help initiate oscillation at start-up. If all components matched perfectly with perfect symmetry and stray impedances, and there was no random thermal noise, the oscillator may not begin oscillation at all. Zener or avalanche diodes D2, D3, D6, D7, D11, D12, and additionally on incoming supply voltage, D14, provide for overvoltage protection and voltage limiting for the protection of the gate structures of the power switching devices and also the control electronics. Q1 and Q2 are utilized as control switches for the control interface to the oscillator power switches. C34 and C35 synchronizing gates of Q1 and Q2 to power oscillator when Q1 and Q2 are not actively utilized for control. Q1 and Q2 are used to force state changes of power switches Q4, Q6 and Q3, Q5, respectively.

Additional ancillary components include U0, C1, C2, C3, L1, and D1, comprising a 5 Volt DC supply for control electronics. Decoupling and noise capacitors are distributed throughout the circuit and include C4, C5, C6, C7, C8, C9, C10, C11, C13, C15, C16, C17, C18, C19, C24, C25, C26, C28, and C29. R2 and R7 ensure unconnected state at external junctions J1 and J3, respectively, do not turn on heater driver unintentionally. Inverting Schmidt-trigger U3, pin-set 5, 6, along with LED, 'Light-Emitting Diode' and resistor combinations R5 with D21 and R4 with D22 provide for visual fault indication. As will be apparent to those of ordinary skill in the art, other suitable ancillary components may also be used.

In accordance with embodiments of the invention, a temperature control of the load within L3 is enabled as a function of variation in the power oscillator tank frequency, here, the variable spray fuel injector containing L3, as a magnetic characteristic of the load changes as a function of temperature. In various embodiments, temperature control may include an interrogation of the tank frequency from the parameter, such as the time varying gate charge of one or more of the oscillator power switches. Such a method of utilizing gate charge to determine tank frequency has been previously disclosed, referenced as U.S. Published Application Number: 20100288755, "Frequency to Voltage Converter Using Gate Voltage Sampling of Power Oscillator", and is hereby included in its entirety by reference.

In accordance with embodiments of the invention, gate voltage is sampled, as a threshold compared to a reference at comparator or operational-amplifier inputs of U1, pin-set 1,2, 3, which generates pulse edges synchronous with power oscillator frequency. These pulse edges are buffered and noise filtered utilizing Schmidt-trigger hysteresis by series of inverting gates U3, pin-sets 1,2 and 3,4. The pulse edges are then utilized as clock pulse inputs to flip-flop U5, pin-set 8, 9, 10, 11, 12, 13. R28 and R29 with C27 and R27 comprise an RxC timing circuit with D13 around flip-flop to create a pulse of pre-determined width with a voltage pre-determined by logic voltage that generates a packet of charge through R30 which charges C20 to a voltage that is now a function of tank frequency.

The voltage as a function of tank frequency is presented to a differential error amplifier or error comparator U2, pin-set 5, 6, 7. Error is determined as the difference from a reference pre-determined by a voltage, here, from resistive divider R34, R35, R36. Some PID servo function, or "Proportional, Integral and Derivative", is provided by the differential error amplifier, with C21 providing derivative compensation, C22 and C23 providing integral compensation and global proportional gain determined by ratio of R31 and R32, here provided R33=R31 and R37=R32. R38 and C23 integrate the error between target voltage reference and voltage as a function of tank frequency.

This error is compared to a triangle wave of pre-determined frequency at comparator or operational-amplifier U1, pin-set 5, 6, 7. This generates a PWM, or "Pulse-Width Modulated" signal ultimately utilized to regulate power of oscillator as a function of temperature-determined tank frequency. Triangle wave is generated by triangle wave generator comprised of U1 pin-sets 8, 9, 10 and 12, 13, 14, along with R39, R40, R41, R42, with frequency set by R×C timer formed with R43 and C12. Range of triangle generator waveform excursion is selected to allow PWM signal to vary between 0% and 100% power duty-cycle.

In accordance with embodiments of the invention, the excessive current condition in the power switches is determined by comparison of a voltage, representing current level, to a threshold at comparator or operational amplifier U2, pin-set 1, 2, 3. The voltage representing a current level is obtained as an IxR drop across a current sense resistor, comprised of resistors R8 and R9 in parallel. The threshold compared with the current level is determined from a voltage proportional to power oscillator supply voltage, here, comprising voltage divider R16 and R17, with D9 providing a maximum limit to current threshold reference voltage level as a function of the forward-biased diode drop voltage. It is desirable to have the threshold level vary with supply voltage as the current in the current sense resistor is also a function of supply voltage, therefore, the change in current as a function of oscillator status should be separated from a change in current as a function of supply voltage. The threshold level as a function of supply voltage is selected such that the current builds at a rate in L3 that if it reaches an excessive level results in a time constant proportional to a frequency lower than the normal operating frequency of the power oscillator. As such, once the power oscillator is oscillating, the current level will be less than the excessive current threshold.

When an excessive current condition exists, the output of U2, pin-set 1, 2, 3, goes to a logic 'LOW' state, presented to inverting Schmidt-trigger U3, pin-set 13, 12, now presents a logic 'HI' state to inputs of AND gates U4, pin-sets 4, 5, 6, and 8, 9, 10. The voltage from power switch gates is provided as a logic input to the AND gates as well, here, from R12 and R13. When the logic condition of AND is satisfied, the output of the respective gate turns on either Q1 or Q2, depending on which power switch gates are charged during the excessive current condition. Q1 or Q2 then deplete charge of the respective sequence of power switches that are carrying the excessive current.

What has been described is a method that determines an excessive current condition, determines the contributing complimentary pair of oscillator power switches, and changes their state such that excessive current condition is interrupted. Concurrently, when one complimentary pair has a state change, this causes a state change of the other complimentary pair of power switches, now building current again in L3 but fully-reversed. Current again is monitored by the current-sense resistor, and a determination is again made for excessive current condition. This cycle continues alternatively until the oscillator functions normally, at which point the frequency should increase such that excessive current is no longer obtained in either complimentary pair of power switches, and Q1 and Q2 synchronize themselves to the power oscillator, and both AND gates U4, pin-sets 4, 5, 6 and 8, 9, 10 have outputs in the 'LOW' logic state.

If an excessive current condition persists for numerous cycles, the logic state at inverting Schmidt-trigger U2, pin-set 12, 13, remains 'HI' for a duty-cycle sufficient to charge C14, through R18 and D10, greater than the discharge rate through R19. This results in the voltage on C14 reaching the logic threshold 'HI' input state on inverting Schmidt-trigger U3, pin-set 10, 11. The inverting state now presents a logic 'LOW' to the input of inverting Schmidt-trigger U3, pin-set 8, 9, which results in a logic 'HI' at reset pin of flip-flop U5, pin-set 1, 2, 3, 4, 5, 6, which serves as a resettable fault latch. Additionally, as determined by a NTC, or 'Negative Temperature Coefficient' device, R21, forming a divider with R20, an over-temperature condition would also set a logic 'LOW' at inverting Schmidt-trigger U3, pin-set 8, 9. Reset of fault is provided at J3, through R6. Fault condition logic state is presented to J2 through R3. Fault latch provides appropriate logic state, combined with logic state of J1 "Heater Enable" at AND gate U1, pin-set 5, 6, 7, to satisfy logic condition at AND gate U4, pin-set 1, 2, 3, such that PWM signal from U1, pin-set 5, 6, 7, passes to control switch Q9.

Control switch Q9, in the configuration of 'high-side' power regulation of the example embodiment, disclosed separately, ultimately determines the average voltage at L2 and thereby controls the power to the power oscillator as a function of power oscillator frequency. Q9 pulls charge out of P-MOSFET Q8 through D16 to allow current to flow between source and drain of Q8 to L2. To minimize switching losses of Q8 during turn-off, Q7 bipolar transistor with Baker circuit comprised of D17, D18 and D19, enable faster charging of Q8 from supply voltage. Q9 also turns off Q7 through Baker circuit and D15. Q7 is turned on by current through R44 and Baker circuit. R45 allows gate of Q8 to reach substantially full supply voltage and avoid diode drop voltage differential across junction of Q7.

Figure 3:
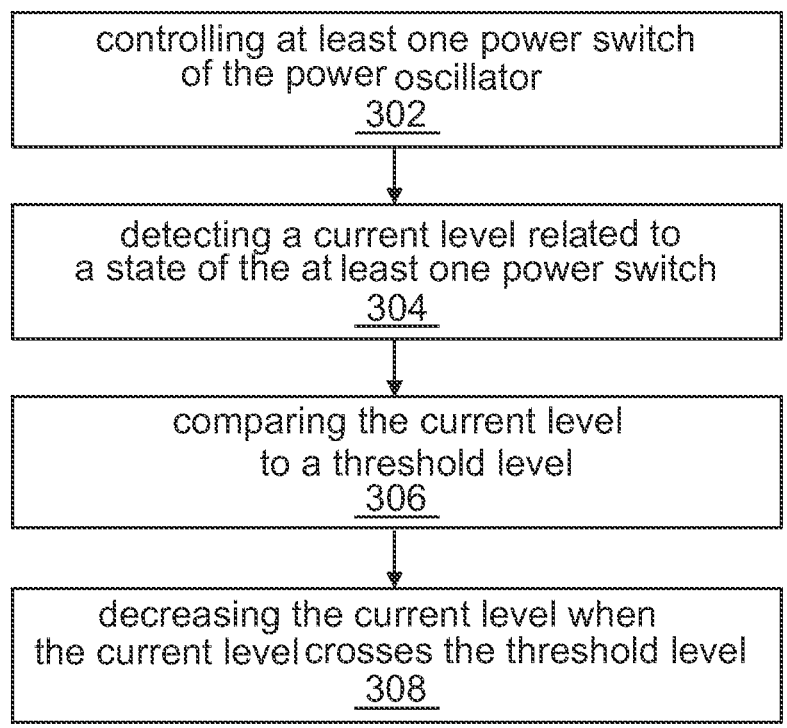
FIG. 3 is a flow chart showing steps of a power-oscillator-starting method in accordance with embodiments of the invention.

FIG. 3 is a flow chart showing steps of a power-oscillator-starting method in accordance with embodiments of the invention. The power-oscillator-starting method of FIG. 3 includes: controlling at least one power switch of the power oscillator, as shown at 302; detecting a current level related to a state of the at least one power switch, as shown at 304; comparing the current level to a threshold level, as shown at 306; and decreasing the current level when the current level crosses the threshold level, as shown at 308.

The foregoing detailed description is to be understood as being in every respect illustrative and exemplary, but not restrictive, and the scope of the invention disclosed herein is not to be determined from the description of the invention, but rather from the claims as interpreted according to the full breadth permitted by the patent laws. For example, while the method of adaptive current limit oscillator starting and restarting of the invention is described herein for the driver of an induction heater coil for the heater in an internal combustion engine fuel injector, the method may be used to start or restart power oscillators, or power oscillators for other induction heaters in other applications. It is to be understood that the embodiments shown and described herein are only illustrative of the principles of the present invention and that various modifications may be implemented by those skilled in the art without departing from the scope and spirit of the invention.

The invention claimed is:

1. A circuit for starting an oscillator, which is configured to provide an oscillating signal to an inductive heating coil for a fuel injector, the circuit comprising:
    an oscillator comprising a tank circuit, the tank circuit comprising the inductive heating coil and having a resonant frequency, the oscillator further comprising first and second transistors coupled to the inductive heating coil and configured to conduct current through said inductive heating coil, the transistors being additionally configured to conduct a first predetermined current through the inductive heating coil when the oscillator circuit is oscillating, the transistors configured such that they conduct more than the first predetermined current when the oscillator circuit is not oscillating;

a transistor current sensor operatively coupled to the transistors and configured to continuously generate a voltage signal, which is representative of current actually flowing through the first and second transistors;

an inductive heating coil current comparator, operatively coupled to the transistor current sensor and a power supply for the transistors, the comparator generating an over-current signal responsive to the current flowing through at least one of the transistors being greater than the first predetermined current; and a transistor disabler coupled to both the comparator and the transistors, the disabler being configured to disable one of the transistors responsive to receipt of the over-current signal from the comparator;

whereby disablement of one of the transistors reduces current flowing through the inductive heating element and causes the oscillator to attempt oscillation.

2. The circuit of claim 1, wherein the transistor disabler comprises a logic gate controlling a gate voltage of the at least one transistor.

3. The circuit of claim 1, wherein the first predetermined amount of current is proportional to a voltage level of a voltage source, that is supplying power to the transistors.

4. The circuit of claim 1, wherein the first predetermined current threshold level is limited by a forward conducting diode.

5. The circuit of claim 1, wherein the first predetermined current is a lesser current than utilized by the transistors when the oscillator is not oscillating at its resonant frequency.

6. The circuit of claim 1, wherein the transistor disabler is configured to turn off a transistor until current through the transistor decreases to approximately zero.

7. A method of starting an oscillator, which is configured to provide an oscillating signal to an inductive heating coil for a fuel injector, the oscillator having a tank circuit comprising the inductive heating coil, the oscillator further comprising first and second transistors coupled to the inductive heating coil, the transistors being configured to conduct a first predetermined current through the inductive heating coil at a resonant frequency of the tank circuit, the oscillator circuit being configured such that when the oscillator is not oscillating, the transistors will conduct more than the first predetermined current through the inductive heating coil, the method of starting the oscillator comprising:
    converting current flowing through the transistors to a first voltage, which is representative of the current actually flowing through the power transistors;
    comparing the first voltage to a reference voltage and generating a transistor over-current signal when the current actually flowing through the transistors exceeds the first predetermined current; and
    disabling one of the transistors responsive to the over-current signal being generated;
    enabling the disabled transistor responsive to the oscillator beginning oscillation.

8. The method of claim 7, wherein disabling one of the transistors comprises using a logic gate to control a gate voltage of the transistor.

9. The method of claim 7, wherein the first predetermined current is proportional to a voltage provided to the transistors.

10. The power-oscillator-starting method of claim 7, wherein the first predetermined current is limited by a forward conducting diode.

11. The power-oscillator-starting method of claim 7, wherein the first predetermined current is a lesser current than utilized by the transistors when the oscillator is not oscillating at its resonant frequency.

12. The method of claim 7, wherein disabling a transistor comprises turning off the transistor until current through the transistor decreases to approximately zero.

* * * * *